(12) United States Patent
Bechman

(10) Patent No.: US 9,385,714 B2
(45) Date of Patent: Jul. 5, 2016

(54) SELF-LEVELING LOGIC RECEIVER

(71) Applicant: SKYWORKS SOLUTIONS, INC., Woburn, MA (US)

(72) Inventor: Gary S Bechman, Cedar Rapids, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/324,011

(22) Filed: Jul. 3, 2014

(65) Prior Publication Data

US 2015/0091610 A1 Apr. 2, 2015

Related U.S. Application Data

(60) Provisional application No. 61/884,610, filed on Sep. 30, 2013.

(51) Int. Cl.
*H03K 19/00* (2006.01)
*H03K 19/003* (2006.01)

(52) U.S. Cl.
CPC ...... *H03K 19/0013* (2013.01); *H03K 19/00361* (2013.01)

(58) Field of Classification Search
CPC ............... H01L 2924/00; H01L 2924/13091; H01L 2924/0002; H01L 21/823814; H01L 27/0922; H01L 29/665; H01L 21/823892; G09G 2310/0289; G09G 2310/0297; G09G 3/3688; G09G 5/00; G09G 3/3696; H03F 1/0205; H03F 2200/03; H03F 3/185; H03F 3/2171; H03F 3/2173; H03F 3/45475; H03F 3/68; H02M 3/1588; H02M 3/156; H02M 1/38; H02M 2001/0025; H02M 3/155; H02M 3/158

USPC .......................................... 326/62, 63, 68, 80
See application file for complete search history.

(56) References Cited

U.S. PATENT DOCUMENTS

| | | | |
|---|---|---|---|
| 8,624,406 B2* | 1/2014 | Murahashi | G09G 3/3685 257/203 |
| 2005/0134312 A1* | 6/2005 | Seo | H03K 19/09485 326/81 |
| 2006/0255835 A1* | 11/2006 | Cordoba | H03K 3/35613 326/68 |
| 2012/0274382 A1* | 11/2012 | Ucciardello | H03K 17/102 327/333 |
| 2013/0182515 A1* | 7/2013 | Lin | G06F 5/10 365/189.15 |

* cited by examiner

*Primary Examiner* — Alexander H Taningco
*Assistant Examiner* — Seokjin Kim
(74) *Attorney, Agent, or Firm* — Chang & Hale LLP

(57) ABSTRACT

Various implementations include circuits, devices and/or methods that provide closed-loop feedback crowbar current limiting for logic level-shifting between circuits with different voltage supplies. Some implementations include a level-shift circuit assembly including an input buffer and a current limiter. The input buffer is configured to receive an incoming logic signal that is set relative to a first electrical level, and in response, provide a level-shifted logic signal that is set relative to a second electrical level and is logically consistent with the incoming logic signal. The current limiter is configured to suppress the generation of current associated with the input buffer by providing a bias modification condition to the input buffer, in order to adjust the operation of the input buffer, in response to sensing a voltage difference between the first electrical level and the second electrical level.

18 Claims, 11 Drawing Sheets

US 9,385,714 B2

SELF-LEVELING LOGIC RECEIVER

RELATED APPLICATIONS

This application claims the benefit of U.S. Provisional Patent Application No. 61/884,610, filed on Sep. 30, 2013, and which is incorporated by reference herein.

TECHNICAL FIELD

The present disclosure relates to electronic circuits, and in particular, to the combination of electronic circuits having different voltage supply levels.

BACKGROUND

The ongoing development of electronics involves improving performance and adding functionality to existing products. These ends are pursued by advancing integrated circuit (IC) technologies. IC technologies typically progress such that newer manufacturing processes enable chips that use lower voltages and less power, while increasing transistor density and switching speeds. This has led to a number of manufacturing processes that are used to produce chips that use different voltage supply levels.

Voltage logic levels—typically the voltage levels that represent the binary values "1" and "0"—on a chip are generally set relative to a voltage supply level. For example, the binary value "1" is typically represented by a voltage supply level provided to a chip ($V_{DD}$); and, the binary value "0" is typically represented by electrical ground (or 0 Volts). Consequently, the voltage logic levels on a chip fabricated by one process may be different from those on another chip fabricated by another process, which creates integration problems for downstream users and manufacturers.

A chip targeting open platforms and markets often includes functionality that permits the chip to receive logic signals from another chip having different voltage logic levels. The functionality is termed "level shifting," and various designs have been previously employed, each having limitations and drawbacks. In particular, receiving logic signals produced by a chip that uses a lower voltage supply level often results in increased power dissipation and deterioration of the previously available level shift circuitry, in addition to data errors caused by inaccurate level shifting.

SUMMARY

Various implementations of circuits, methods and devices within the scope of the appended claims each have several aspects, no single one of which is solely responsible for the attributes described herein. Without limiting the scope of the appended claims, some prominent features are described. After considering this disclosure, and particularly after considering the section entitled "Detailed Description," one will understand how the aspects of various implementations enable closed-loop feedback crowbar current limiting for logic level-shifting between circuits with different voltage supplies.

To that end, some implementations include a level-shift circuit including a closed-loop feedback crowbar current limiting assembly. More specifically, the level-shift circuit includes an input buffer configured to receive an incoming logic signal that is set relative to a first electrical level, and in response, provide a level-shifted logic signal that is set relative to a second electrical level and is logically consistent with the incoming logic signal. The level-shift circuit also includes a current limiter configured to suppress the generation of current associated with the input buffer by providing a bias modification condition to the input buffer, in order to adjust the operation of the input buffer, in response to sensing a voltage difference between the first electrical level and the second electrical level.

In some implementations, the input buffer includes a logic inverter having an input node configured to receive the incoming logic signal, and an output node configured to provide the level-shifted logic signal. In some implementations, the level-shift circuit includes an output buffer configured to invert the level-shifted logic signal provided at the output of the input buffer.

In some implementations, the first electrical level includes a first voltage level, the second electrical level includes a second voltage level that is different from the first voltage level. In some implementations, the first voltage level is lower than second voltage level. In some implementations, the first voltage level is a first ground potential level associated with source logic, and the second voltage level is a second ground potential level associated with receiving logic. In some implementations, the current limiter is configured to produce the bias modification condition such that the bias modification condition tracks the sensed voltage difference. In some implementations, the current limiter is configured to produce the bias modification condition such that the bias modification condition is provided when the sensed voltage difference breaches a threshold.

In some implementations, the current limiter includes a mirror-based feedback circuit including first and second branches. The first branch is configured to impose the bias modification condition on the input buffer, and the first branch responsive to the incoming logic signal and a control current. The second branch is configured to generate the control current in response to sensing a voltage transition in the incoming logic signal. In some implementations, the input buffer includes a first NFET and the second branch of the current limiter includes a second NFET that is sized to turn on sooner than the first NFET in response to the same voltage transitions of the incoming logic signal. In some implementations, the input buffer includes a diode-connected NFET coupled between the first NFET and ground, and the second branch of the current limiter includes another diode-connected NFET coupled between the second NFET and ground. In some implementations, the second branch of the current limiter includes a FET that is sized to turn off before a voltage level associated with the threshold voltage of another FET.

In some implementations, the incoming logic signal includes a plurality of logic states, and each of the plurality of logic states is set relative to the first electrical level, and each of the plurality of logic states is set relative to the second electrical level. In some implementations, the level-shift circuit is included on a chip with receiving logic, the level-shift circuit and the receiving logic having a common voltage supply level associated with the second electrical level. In some implementations, the level-shift circuit is arranged between source logic and receiving logic, wherein the source logic receives a first voltage supply level, and the level-shift circuit and the receiving logic receive a second voltage supply level.

Some implementations include a module a packaging substrate, an input buffer and a current limiter. The packing substrate is configured to receive a plurality of components. The input buffer is at least partially included on the packaging substrate, the input buffer configured to receive an incoming logic signal that is set relative to a first electrical level, and in response, provide a level-shifted logic signal that is set relative to a second electrical level and is logically consistent with the incoming logic signal. The current limiter is at least partially included on the packaging substrate, the current limiter configured to suppress the generation of current associated with the input buffer by providing a bias modification condition to the input buffer, in order to adjust the operation of the input buffer, in response to sensing a voltage difference between the first electrical level and the second electrical level.

In some implementations, at least a portion of each of the input buffer and the current limiter are included on a first chip configured to receive a voltage supply level associated with the second electrical level. In some implementations, the first chip includes receiving logic coupled to receive the level-shifted logic signal, and an output buffer coupled between the input buffer and the receiving logic. In some implementations, the module also includes source logic on a second chip configured to receive a voltage supply level associated with the first electrical level, the source logic also coupled to provide the incoming logic signal to the input buffer.

Some implementations includes a device including an input buffer, a processor and a non-transitory memory. The input buffer is configured to receive an incoming logic signal that is set relative to a first electrical level, and in response, provide a level-shifted logic signal that is set relative to a second electrical level and is logically consistent with the incoming logic signal. In some implementations, the memory includes instructions, that when executed by the processor cause the device to suppress the generation of current associated with the input buffer by sensing a difference between the first and second electrical levels, generating one or more bias modification conditions, and providing the one or more bias modifications conditions to the input buffer in order to adjust the operation of the input buffer.

Some implementations include a method of level-shifting a logic signal. In various implementations, the method includes: receiving at an input buffer an incoming logic signal that is set relative to a first electrical level; providing a level-shifted logic signal that is set relative to a second electrical level and is logically consistent with the incoming logic signal; sensing a difference between the first and second electrical levels; generating one or more bias modification conditions in response to sensing the difference between the first and second electrical levels; and, providing the one or more bias modifications conditions to the input buffer in order to adjust the operation of the input buffer.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
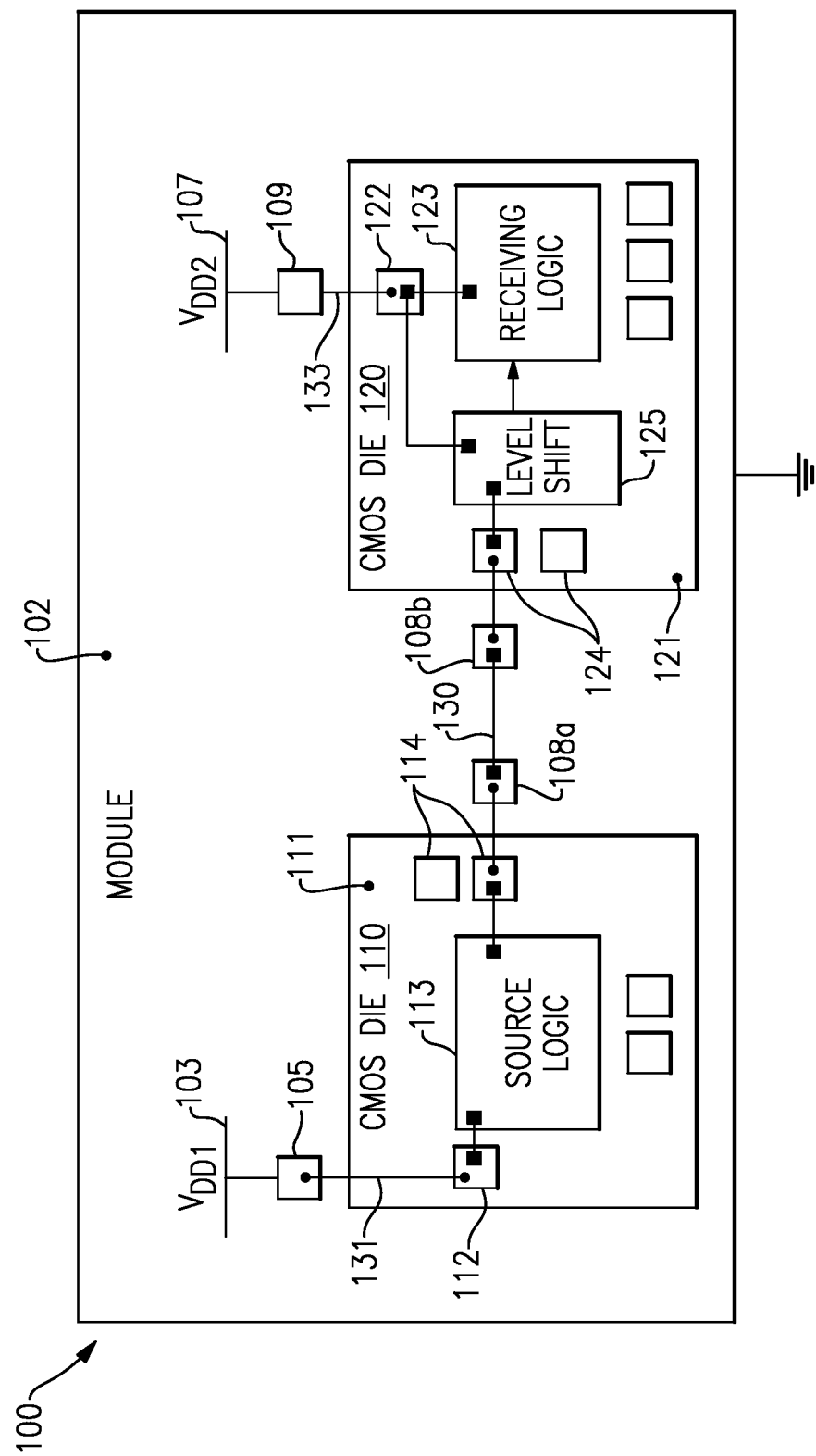
FIG. 1 is a schematic diagram of a module including two integrated circuit chips powered by different voltage supplies according to some implementations.

In accordance with common practice various features shown in the drawings may not be drawn to scale, as the dimensions of various features may be arbitrarily expanded or reduced for clarity. Moreover, the drawings may not depict all of the aspects and/or variants of a given system, method or apparatus admitted by the specification. Finally, like reference numerals are used to denote like features throughout the drawings.

DESCRIPTION

Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

As noted above, the voltage logic levels on a chip fabricated by one process may be different from those on another chip fabricated by another process, which creates integration problems for downstream users and manufacturers. In order to alleviate some of these integration problems, an integrated circuit chip produced for open platforms and markets often includes additional circuitry that permits the chip to receive logic signals from another chip having different voltage logic levels. As described below with reference to FIG. 1, the additional circuitry is referred to as "level-shifting" circuitry and is particularly useful for receiving logic signals from a chip using a lower voltage supply level. FIG. 1 is a schematic diagram of a module 100 including first and second chips 110, 120 (i.e., CMOS die 110 and CMOS die 120) powered by respective first and second voltage supply lines ($V_{DD1}$) 103, ($V_{DD2}$) 107 according to some implementations. In some implementations, the module 100 is included in a number of electronic devices including, without limitation, a computer, a laptop computer, a tablet computer, a netbook, an internet kiosk, a personal digital assistant, a mobile phone, a smartphone, a gaming device, a computer server, or any other computing device. Additionally, while pertinent features are illustrated, those skilled in the art will appreciate from the present disclosure that various other features have not been illustrated for the sake of brevity and so as not to obscure more pertinent aspects of the example implementations disclosed herein.

To that end, as a non-limiting example, the module 100 includes the aforementioned first and second chips 110, 120 and the respective first and second voltage supply lines ($V_{DD1}$) 103, ($V_{DD2}$) 107. In some implementations, the first and second voltage supply lines ($V_{DD1}$) 103, ($V_{DD2}$) 107 each receive their respective voltage levels $V_{DD1}$, $V_{DD2}$ from a power supply (not shown) including at least one of a battery, a battery charger, a voltage supply rail, an AC-to-DC converter and a connection to an external power source. As described in greater detail below, in one example, the first voltage supply level $V_{DD1}$ is lower than the second voltage supply level $V_{DD2}$. In turn, logic signals received from the first chip 110 cause excessive current draw and data errors when the level-shift circuit 125 (on the second chip 120) uses previously available level-shifting technology.

The module 100 also includes a packaging substrate 102, connection pads 105, 108a, 108b, 109 on the packaging substrate 102, and conductive traces or printed metal lines (e.g., conducting line 130) on the packaging substrate 102. The connection pads 105, 108a, 108b, 109 on the packaging substrate 102 facilitate electrical connections to and from the first and second chips 110, 120.

For example, the first voltage supply line ($V_{DD1}$) 103 is coupled to the first chip 110 using the connection pad 105. A wire bond 131 couples the connection pad 105 to a corresponding connection pad 112 included on the first chip 110. Similarly, wire bond 133 couples the connection pad 109 to a corresponding connection pad 122 included on the second chip 120 in order to connect the second voltage supply line ($V_{DD2}$) 107 to the second chip 120. Those skilled in the art will appreciate that connection pads can be coupled to one another using alternatives to wire bonds, such as solder bumps, conductive pins, etc. Connection pads 108a and 108b are used to couple logic signals between the first and second chips 110, 120. More specifically, the connection pad 108a is coupled to a corresponding one of the plurality of connection pads 114 on the first chip 110, and the connection pad 108b is coupled to a corresponding one of the plurality of connection pads 124 on the second chip 120. The connection pads 108a and 108b are coupled to one another through the conducting line 130, and to the respective first and second chips 110, 120 using at least one of, without limitation, wire bonds, solder bumps, conductive pins, etc.

The first chip 110 (i.e., CMOS die 110) includes source logic 113 and the aforementioned connection pads 112, 114 formed on a substrate 111. The source logic 113 is coupled to the first voltage supply line ($V_{DD1}$) 103 via connection pad 112 in order to receive the first voltage supply level $V_{DD1}$. The source logic 113 is also coupled to at least one of the plurality of connection pads 114 to supply an output logic signal, which is routed to the second chip 120. Those skilled in the art will appreciate from the present disclosure that numerous other connections to and from the first and second chips 110, 120 are contemplated, but only a limited number have been described for the sake of brevity.

The second chip 120 (i.e., CMOS die 120) includes receiving logic 123, a level-shift circuit 125, and the aforementioned connection pads 122, 124. The receiving logic 123 and the level-shift circuit 125 are coupled to the second voltage supply line ($V_{DD2}$) 107 via connection pad 122 in order to receive the second voltage supply level $V_{DD2}$. The level-shift circuit 125 is coupled to one of the plurality of connection pads 124 to receive the logic signal provided by the first chip 110. The level-shift circuit 125 is further coupled to the receiving logic 123 in order to provide a translated logic signal to the receiving logic 123.

In operation, the level-shift circuit 125 operates to translate the voltage logic levels of the logic signal provided by the first chip 110 to the corresponding voltage logic levels used by the receiving logic 123. In other words, the translated logic signal is a level-shifted version of the logic signal received from the first chip 110. Previously available level-shifting technologies each have limitations and drawbacks. In particular, previously available technologies cannot adequately receive a logic signal from a chip that uses a lower voltage supply level than the receiving chip (e.g., $V_{DD1} < V_{DD2}$) without substantial performance penalties. For example, with continued reference to FIG. 1, the performance penalties arise when the first voltage supply level $V_{DD1}$ is lower than the second voltage supply level $V_{DD2}$ and the level-shift circuit 125 uses a previously available level-shifting technology. In such circumstances, a logic signal from the first chip 110 subjects the second chip 120 to increased power dissipation, deterioration of the previously utilized level-shift circuitry, and data errors.

Figure 2:
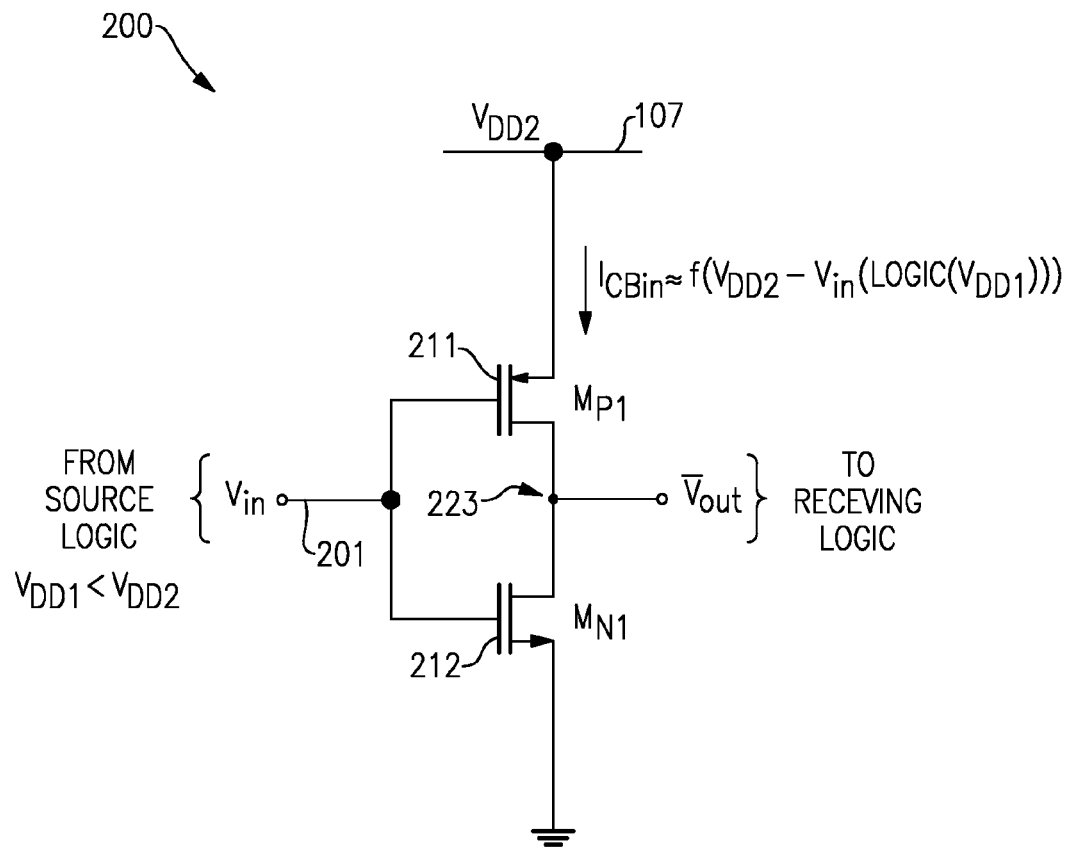
FIG. 2 is a schematic diagram of a level shift circuit not enabled with a closed-loop feedback crowbar current limiter in accordance with some implementations.

Continuing the example above, the buffer 200 shown schematically in FIG. 2 is a previously available implementation of the level-shift circuit 125 of FIG. 1. The buffer 200 includes a PFET ($M_{P1}$) 211 and a NFET ($M_{N1}$) 212 arranged as an inverter. The source of the PFET ($M_{P1}$) 211 is coupled to the second voltage supply line ($V_{DD2}$) 107, and the drain of the PFET ($M_{P1}$) 211 is coupled to the drain of the NFET ($M_{N1}$) 212 at node 223. The node 223 also serves as the output node of the buffer 200. The gates of both the PFET ($M_{P1}$) 211 and the NFET ($M_{N1}$) 212 are arranged to receive a logic signal ($V_{in}$) from the first chip 110 shown in FIG. 1.

In operation, when the first voltage supply level $V_{DD1}$ is lower than the second voltage supply level $V_{DD2}$, an undesired current ($I_{CBin}$) is produced because at least one of the voltage logic levels of the incoming logic signal ($V_{in}$) causes both the PFET ($M_{P1}$) 211 and the NFET ($M_{N1}$) 212 to enter an active region of operation simultaneously. In other words, the PFET ($M_{P1}$) 211 and the NFET ($M_{N1}$) 212 are both turned on in response to a voltage level of approximately $V_{DD1}$ (or lower) applied at the respective gates, which in turn creates a conductive path between the voltage supply line ($V_{DD2}$) 107 and ground. In many cases the at least one voltage logic level that causes both transistors to turn on is the binary value "1", which is typically associated with the first and second voltage supply levels $V_{DD1}$, $V_{DD2}$ on the first and second chips 110, 120, respectively. The undesired current ($I_{CBin}$) is referred to as a crowbar current, is preferably confined to transitions between logic levels of the incoming logic signal ($V_{in}$). However, when the first voltage supply level $V_{DD1}$ is lower than the second voltage supply level $V_{DD2}$, a significant crowbar current ($I_{CBin}$) is also produced whenever the logic signal ($V_{in}$) has a voltage logic level that matches the first voltage supply level $V_{DD1}$. As a result, in normal operation, a substantial crowbar current ($I_{CBin}$) is expected to flow through the buffer 200 when the first voltage supply level $V_{DD1}$ is lower than the second voltage supply level $V_{DD2}$.

The crowbar current ($I_{CBin}$) can be approximated as a function of the voltage difference between the second voltage supply level $V_{DD2}$ and the first voltage supply level $V_{DD1}$ (i.e., $I_{CBin} \sim f(V_{DD2} - V_{in}(\text{Logic}(V_{DD1})))$). As noted above, the crowbar current ($I_{CBin}$) increases power dissipation by the buffer 200 and is potentially damaging to the PFET ($M_{P1}$) 211 and the NFET ($M_{N1}$) 212, which are not capable of handling a significant and prolonged current. Moreover, as described above, the crowbar current is often characterized by a difference between the first and second voltage supply levels $V_{DD1}$, $V_{DD2}$ because it is common for the first and second chips 110, 120 to share a common ground potential. As such, the crowbar current ($I_{CBin}$) is not usually produced when the gates of the PFET ($M_{P1}$) 211 and the NFET ($M_{N1}$) 212 are simultaneously grounded, as for binary 0's. However, that assumption is relatively safe so long as the ground potential of the first and second chips 110, 120 are substantially equivalent. A crowbar current ($I_{CBin}$) can be produced when the first and second chips 110, 120 do not share a common ground potential. In turn, those skilled in the art will appreciate the applicability of the example implementations described below when level-shifting is employed for chips that do not share a common ground potential.

Figure 3:
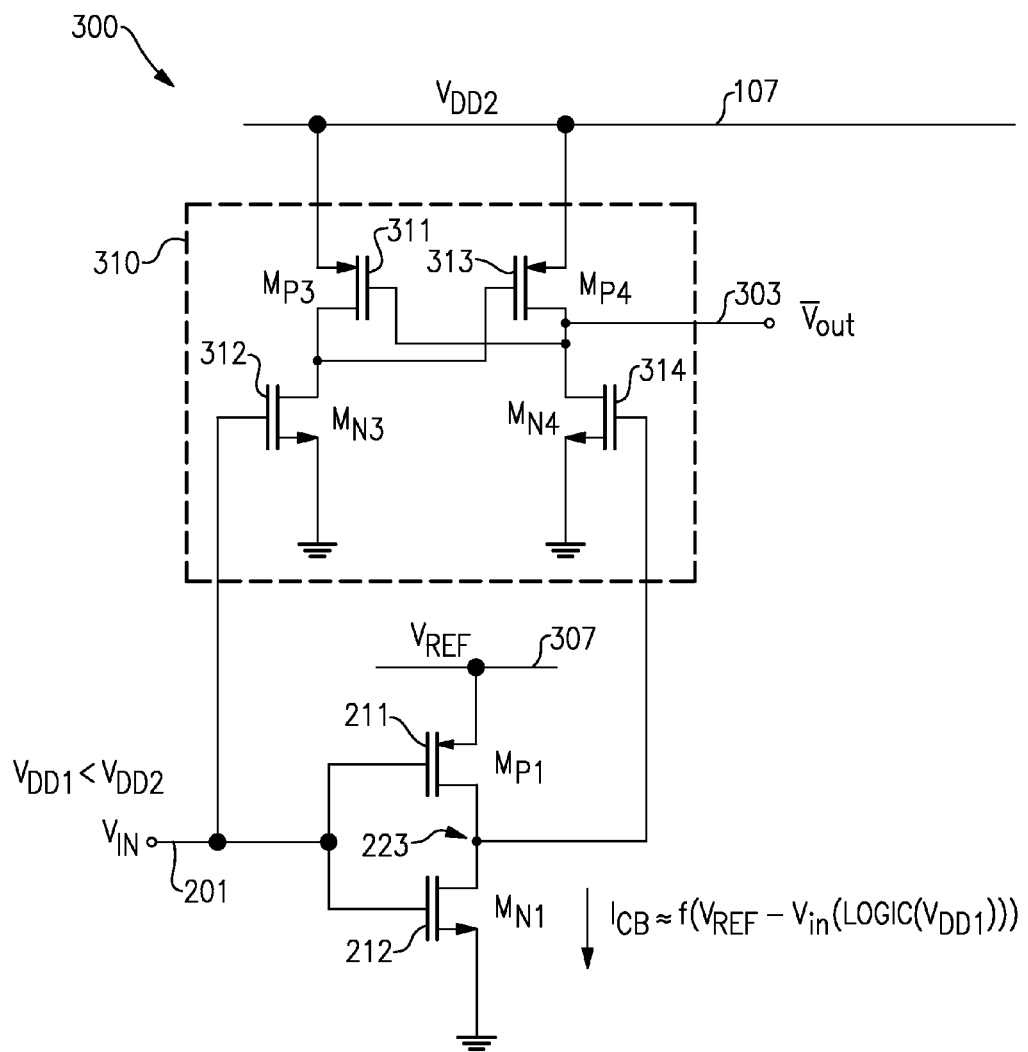
FIG. 3 is a schematic diagram of a level shift circuit not enabled with a closed-loop feedback crowbar current limiter in accordance with some implementations.

The level-shift circuit 300 shown schematically in FIG. 3 is a previously available alternative to the buffer 200 of FIG. 2. The level-shift circuit 300 illustrated in FIG. 3 is similar to and adapted from the buffer 200 illustrated in FIG. 2. Elements common to each include common reference numbers, and only the differences between FIGS. 2 and 3 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, the level-shift circuit 300 additionally includes a reference voltage supply line ($V_{REF}$) 307 and a cross-coupled PFET network 310. The level-shifting function of this implementation is dependent on having a reference voltage level $V_{REF}$ which is equal to the first voltage level $V_{DD1}$ (e.g., by directly receiving $V_{DD1}$, or by internal generation of $V_{REF}$ using a priori knowledge of $V_{DD1}$). More specifically, the source of the PFET ($M_{P1}$) 211 is coupled to the reference voltage supply line ($V_{REF}$) 307. The reference voltage supply level $V_{REF}$ is set to match the voltage supply level used by the source logic (e.g., first voltage supply level $V_{DD1}$). The cross-coupled PFET network 310 includes cross-coupled PFETs ($M_{P3}$, $M_{P4}$) 311, 313 and respective NFETs ($M_{N3}$, $M_{N4}$) 312, 314. The sources of the PFETs ($M_{P3}$, $M_{P4}$) 311, 313 are coupled to the second voltage supply line ($V_{DD2}$) 107. The drain of the PFET ($M_{P3}$) 311 is coupled to the drain of the NFET ($M_{N3}$) 312 and to the gate of the PFET ($M_{P4}$) 313. The drain of the PFET ($M_{P4}$) 314 is coupled to the drain of the NFET ($M_{N4}$) 314 at node 303, and to the gate of the PFET ($M_{P3}$) 311 at node 303. The node 303 also serves as the output node of the level-shift circuit 300 and is provided to deliver an inverted and level-shifted logic signal ($V_{out}$). The gates of the PFET ($M_{P1}$) 211 and the NFETs ($M_{N1}$, $M_{N3}$, $M_{N4}$) 212, 312, 314 are arranged to receive an incoming logic signal ($V_{in}$) from the first chip 110 shown in FIG. 1. The inverted and level-shifted logic signal ($V_{out}$) is directed to the receiving logic 123 through one or more logic inverters.

In operation, the level-shift circuit 300 attempts to reduce the crowbar current ($I_{CBin}$) by isolating the respective binary voltage logic levels of the incoming logic signal ($V_{in}$) in order to achieve more definitive transistor switching between the on and off states of the transistors involved. To that end, when the voltage level of the incoming logic signal ($V_{in}$) is at or near the first voltage supply level $V_{DD1}$ the PFET ($M_{P1}$) 211 should be off and the NFET ($M_{N1}$) 212 should be on. However, the PFET ($M_{P1}$) 211 and the NFET ($M_{N1}$) 212 go into the desired on and off states simultaneously when the first voltage supply level $V_{DD1}$ matches the reference voltage level $V_{REF}$ within a threshold range. In use, the two voltage supply levels $V_{DD1}$, $V_{REF}$ may not match within the threshold range for a variety of reasons. For example, the components associated with one or both voltage supply levels $V_{DD1}$, $V_{REF}$ may have manufacturing or operating faults that prevent the accurate generation of one or both of the voltage supply levels $V_{DD1}$, $V_{REF}$. Additionally, the drive strength of the transistors providing the logic signal ($V_{in}$) may not be sufficient to ensure definitive transistor switching even when $V_{DD1}$, $V_{REF}$ are sufficiently matched. For example, the logic signal ($V_{in}$) may be received by the second chip 120 such that the voltage logic level (e.g., binary "1") associated with the voltage supply level $V_{DD1}$ at its transmission is not close enough to the voltage supply level $V_{DD1}$ to achieve definitive transistor switching at the receiver. In other words, the transmitted voltage levels decay between the transmitting chip and the receiving chip. Voltage decay can be the result of, for example, parasitic impedances in the signal lines, transmission line interference and/or fluctuations in the power supply provided to the transmitting chip.

Figure 4:
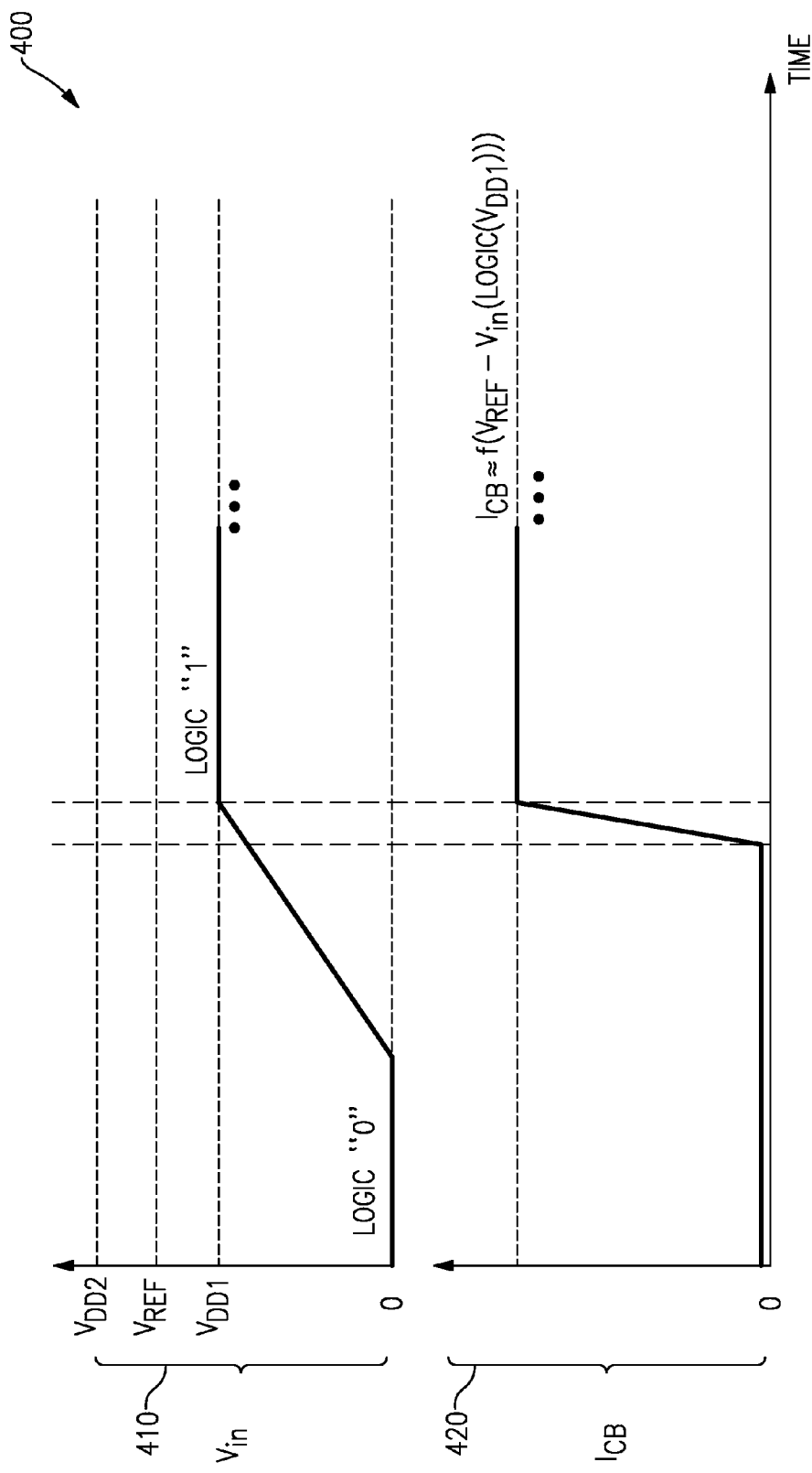
FIG. 4 is a performance diagram showing crowbar current produced in response to a voltage logic level that is lower than a reference voltage level at a receiver.

With continued reference to FIGS. 1 and 3, FIG. 4 is a simplified performance diagram showing a current response 420 of the level-shift circuit 300 produced in response to a voltage logic signal 410. When the incoming logic signal ($V_{in}$) produced by the first chip 110 transitions from binary "0" to binary "1", the voltage level rises from ground to the first voltage level $V_{DD1}$ (or to a lower voltage level as a result of other factors, such as parasitic impedances, etc.). When the voltage logic level of the incoming logic signal ($V_{in}$) associated with $V_{DD1}$ and $V_{REF}$ do not adequately match, the incoming logic signal ($V_{in}$) causes both the PFET ($M_{P1}$) 211 and the NFET ($M_{N1}$) 212 to enter an on state simultaneously, which leads to the crowbar current response 420. The resulting crowbar current ($I_{CBin}$) can be approximated as a function of the difference between the reference voltage supply level $V_{REF}$ and the first voltage supply level $V_{DD1}$ (i.e., $I_{CBin} \sim f(V_{REF}-V_{in}(\text{Logic}(V_{DD1})))$) or the actual received voltage (i.e., $I_{CBin} \sim f(V_{REF}-V_{in}(\text{Logic}(V_{Rx})))$).

By contrast, the various implementations described herein include systems, methods and/or circuit-based devices that provide a level-shift circuit operating configuration including a closed-loop feedback crowbar current limiting circuit assembly. Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

Some implementations include a level-shift circuit assembly including an input buffer and a current limiter. The input buffer is configured to receive an incoming logic signal that is set relative to a first electrical level, and in response, provide a level-shifted logic signal that is set relative to a second electrical level and is logically consistent with the incoming logic signal. The current limiter is configured to suppress the generation of current associated with the input buffer by providing a bias modification condition to the input buffer, in order to adjust the operation of the input buffer, in response to sensing a voltage difference between the first electrical level and the second electrical level.

As a more specific example, as provided in some implementations, a closed-loop feedback crowbar current limiter is provided to limit the current produced when level-shifting a logic signal. In some implementations, the closed-loop feedback crowbar current limiter substantially reduces, if not eliminates, the generation of a crowbar current by sensing a difference between corresponding voltage logic levels, and responsively modifying one or more bias conditions of devices included in a level-shift circuit. For at least some logic interfaces, the disparate voltage supply levels occur such that the source (or driving) logic is supplied with a lower voltage level than the receiving logic (e.g., $V_{DD1}<V_{DD2}$ as described above with reference to FIG. 1).

Figure 5:
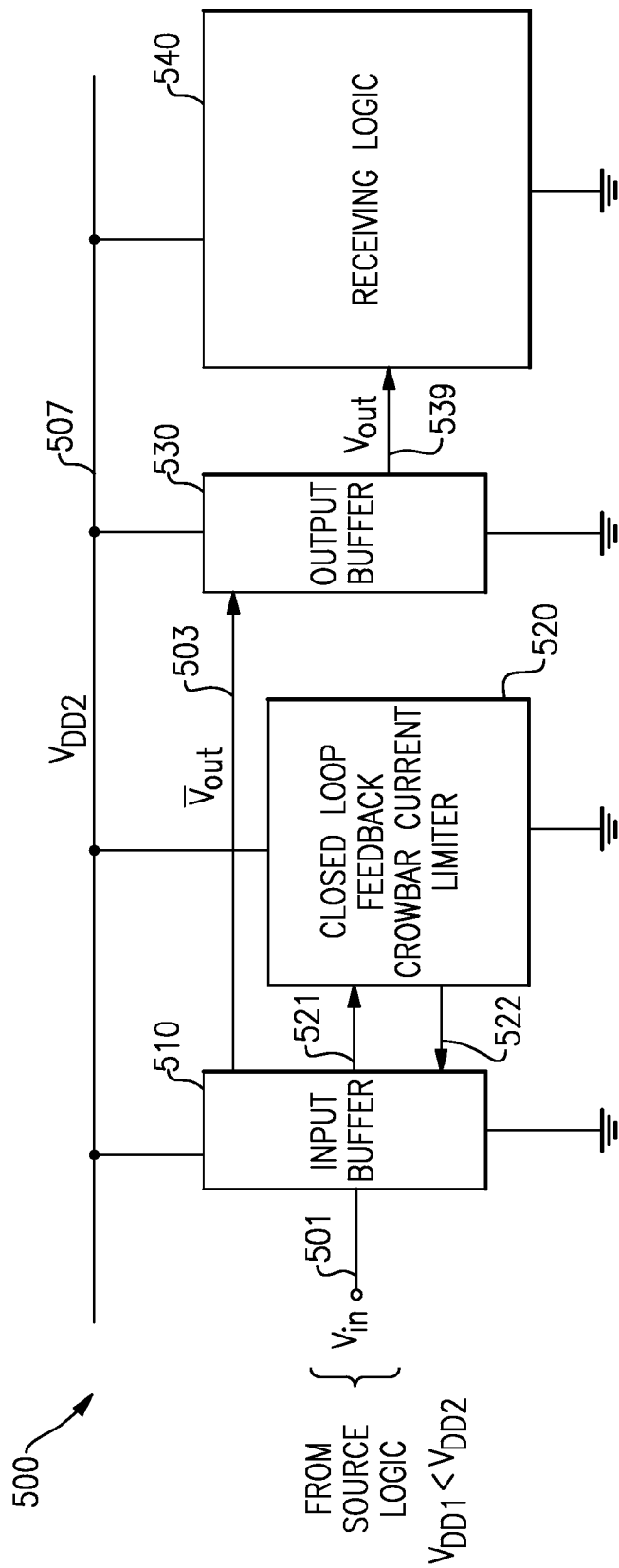
FIG. 5 is a block diagram of a level shift circuit operating configuration including a closed-loop feedback crowbar current limiter in accordance with some implementations.

FIG. 5 is a block diagram of a level-shift circuit 500 including a closed-loop feedback crowbar current limiter 520 according to some implementations. While certain specific features are illustrated, those skilled in the art will appreciate from the present disclosure that various other features have not been illustrated for the sake of brevity and so as not to obscure more pertinent aspects of the example implementations disclosed herein. To that end, the level-shift circuit operating configuration 500 includes an input buffer 510, the aforementioned closed-loop feedback crowbar current limiter 520, and an output buffer 530. FIG. 5 also includes a representation of receiving logic 540 because in some implementations the level-shift circuit 500 and the receiving logic 540 are included on the same chip and/or in the same module having a common voltage supply level ($V_{DD2}$).

The input buffer 510, the closed-loop feedback crowbar current limiter 520, the output buffer 530, and the receiving logic 540 are coupled to the voltage supply line ($V_{DD2}$) 507. The input buffer 510 includes an input node 501 provided to receive a logic signal ($V_{in}$) from another chip (e.g. the first chip 110 of FIG. 1) or module. The input buffer 510 also includes an output node 503 coupled to the output buffer 530. The output node 503 is provided to deliver an inverted and level-shifted logic signal to the output buffer 530. The output buffer 530 includes an output node 539 coupled to the receiving logic 540. The output node 539 is provided to deliver a level-shifted logic signal ($V_{out}$) to the receiving logic 540 that is logically consistent with the incoming logic signal ($V_{in}$).

The closed-loop feedback crowbar current limiter 520 includes an input node 521 coupled to the input buffer 510. The input node 521 is provided to receive an indication of a received voltage level associated with at least a first logic state (e.g., binary "1") of the incoming logic signal ($V_{in}$). In some implementations, in order to maintain logical consistency between the chip or module providing the incoming logic signal ($V_{in}$) and the receiving logic 540, the first logic state of the incoming logic signal ($V_{in}$) is associated with a corresponding voltage level (e.g., $V_{DD2}$) that is utilized by the receiving logic 540. In other words, if the source logic uses the voltage supply level $V_{DD1}$ to represent binary "1", then binary "1" is also represented by the corresponding voltage supply level $V_{DD2}$ used by the receiving logic. In some implementations, logical consistency is maintained by inverting the incoming logic signal. In some implementations, logical consistency is maintained by mapping logic states from the incoming logic signal to logic states used by the receiving logic. The closed-loop feedback crowbar current limiter 520 also includes a feedback node 522 that is coupled to the input buffer 510 to provide one or more bias conditions.

In operation, the input buffer 520 inverts and level-shifts the incoming logic signal ($V_{in}$) received from the source logic. In turn, the output buffer 530 then inverts the inverted and level-shifted logic signal so that the receiving logic 540 receives a level-shifted logic signal ($V_{out}$) that is logically consistent with the incoming logic signal ($V_{in}$). In order to substantially reduce, if not eliminate, the generation of a crowbar current in the input buffer 510, the closed-loop feedback crowbar current limiter 520 senses a voltage difference between corresponding voltage logic levels, generates one or more bias modification conditions, and provides the one or more bias modifications conditions to the input buffer 510. The one or more bias modification conditions suppress the generation of a crowbar current in the input buffer 510, which is uncontrollably generated in previously available level-shift circuits (e.g., as described above) when corresponding voltage logic levels do not sufficiently match. In some implementations, the closed-loop feedback crowbar current limiter 520 senses whether or not there is a substantial voltage difference between a corresponding voltage level of a first logic state of the incoming signal ($V_{in}$) and the second voltage supply level $V_{DD2}$ utilized by the receiving logic 540 for the first logic state, based on the voltage level indication received at input node 521. In particular, for example, the closed-loop feedback crowbar current limiter 520 senses whether the voltage level that represents binary "1" (e.g., $V_{DD1}$ or lower) in the incoming logic signal ($V_{in}$) is substantially lower than the corresponding voltage level that represents a binary "1" (e.g., $V_{DD2}$) in the receiving logic 540. In response to sensing a substantial voltage difference, the closed-loop feedback crowbar current limiter 520 provides one or more modified bias conditions to the input buffer 510 through feedback node 522 in order to reduce, if not eliminate, the generation of a crowbar current ($I_{CBin}$).

Figure 6:
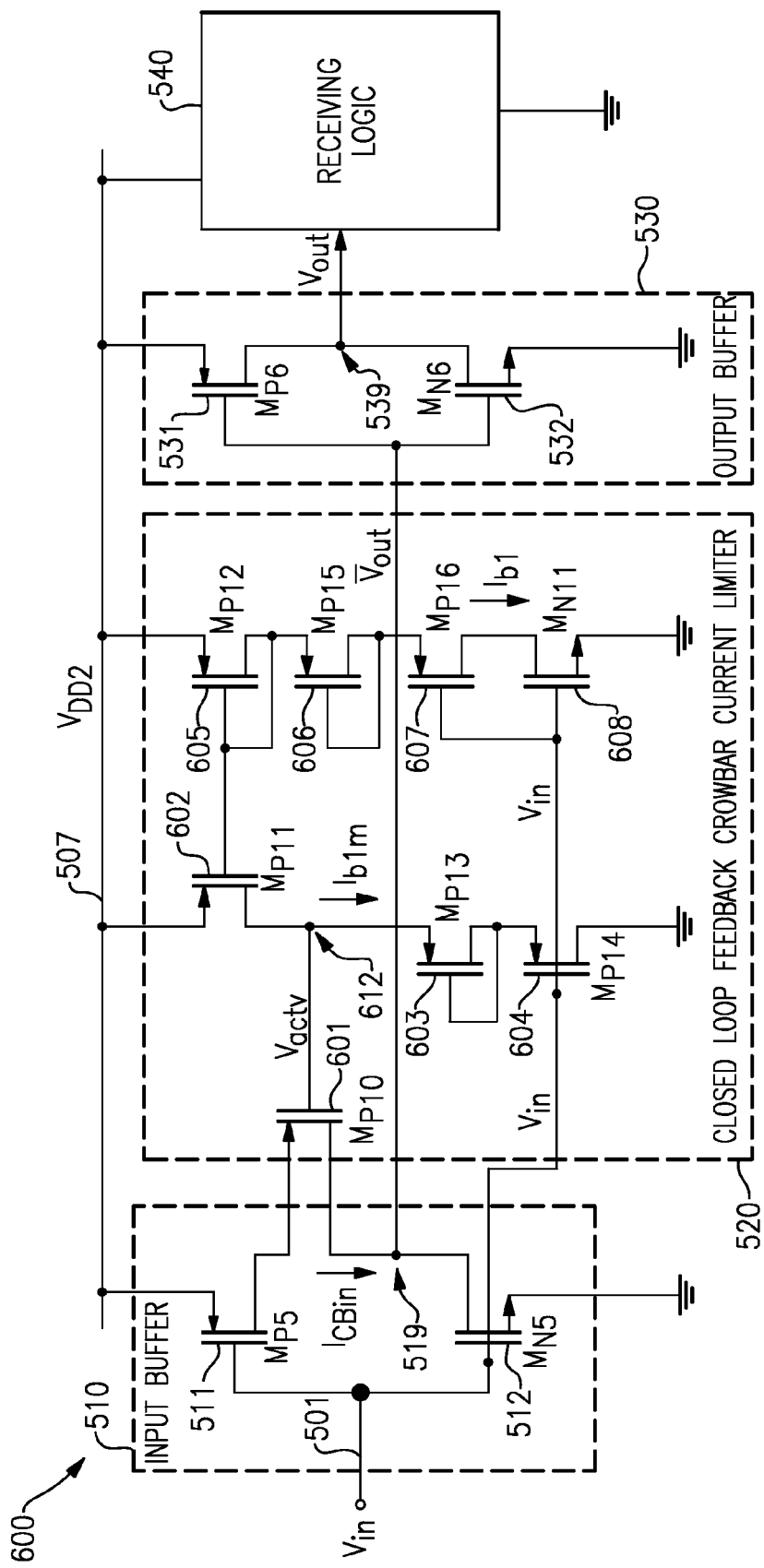
FIG. 6 is a schematic diagram of a level shift circuit including a closed-loop feedback crowbar current limiter in accordance with some implementations.

FIG. 6 is a schematic diagram of an implementation of a level-shift circuit 600 including a circuit implementation of the aforementioned closed-loop feedback crowbar current limiter 520. The receiving logic 540 is also shown in FIG. 6, because in some implementations the level-shift circuit 600 and the receiving logic 540 are included on the same chip and/or module. Elements common to FIGS. 5 and 6 include common reference numbers, and only the differences between FIGS. 5 and 6 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, in some implementations, the input buffer 510 includes a PFET ($M_{P5}$) 511 and a NFET ($M_{N5}$) 512 arranged in a modified inverter configuration. The source of the PFET ($M_{P5}$) 511 is coupled to the voltage supply line ($V_{DD2}$) 507. The drain of the PFET ($M_{P5}$) 511 is coupled to the drain of the NFET ($M_{N5}$) 512 through a feedback PFET ($M_{P10}$) 601. The input buffer 510 includes an output node 519 at the drain of the NFET ($M_{N5}$) 512, which is coupled to the output buffer 530. The gates of both the PFET ($M_{P5}$) 511 and the NFET ($M_{N5}$) 512 are arranged to receive an incoming logic signal ($V_{in}$) from source logic (e.g., the first chip 110 shown in FIG. 1).

The output buffer 530 includes a PFET ($M_{P6}$) 531 and a NFET ($M_{N6}$) 532 arranged as an inverter. The source of the PFET ($M_{P6}$) 531 is coupled to the voltage supply line ($V_{DD2}$) 507, and the drain of the PFET ($M_{P6}$) 531 is coupled to the drain of the NFET ($M_{N6}$) 532 at the output node 539. The gates of both the PFET ($M_{P6}$) 531 and the NFET ($M_{N6}$) 532 are arranged to receive the inverted and level-shifted logic signal from the node 519 of the input buffer 510.

In some implementations, the closed-loop feedback crowbar current limiter 520 includes a number of PFETs ($M_{P10}$-$M_{P16}$) and an NFET ($M_{N11}$). The PFETs ($M_{P10}$-$M_{P16}$) and an NFET ($M_{N11}$) are arranged to provide a mirror-based feedback circuit. The mirror-based feedback circuit is responsive to a voltage difference between a corresponding voltage level of the incoming logic signal ($V_{in}$) and the voltage supply level $V_{DD2}$ utilized by the receiving logic 540. To that end, the source of the feedback PFET ($M_{P10}$) 601 is coupled to the drain of the PFET ($M_{P5}$) 511, and the drain of the feedback PFET ($M_{P10}$) 601 is coupled to the drain of the NFET ($M_{N5}$) 512 as described above. The gate of the feedback PFET ($M_{P10}$) 601 is coupled to a feedback bias node 612 included in a first branch of the closed-loop feedback crowbar current limiter 520. As described below, the feedback bias node 612 is provided to deliver a bias modification condition ($V_{DD2}$) to the feedback PFET ($M_{P10}$) 601.

The first branch includes the PFETs ($M_{P11}$, $M_{P13}$, $M_{P14}$) 602, 603, 604 stacked drain-to-source between the voltage supply line ($V_{DD2}$) 507 and ground. The feedback bias node 612 is located at the drain-source connection between the PFETs ($M_{P11}$, $M_{P13}$) 602, 603. The gate of the PFET ($M_{P13}$) 603 is coupled to its own drain, and the gate of the PFET ($M_{P14}$) 604 is coupled to receive the incoming logic signal ($V_{in}$) from the source logic.

The gate of the PFET ($M_{P11}$) 602 is coupled to the gate of the PFET ($M_{P12}$) 605 included in a second branch of the closed-loop feedback crowbar current limiter 520. The second branch includes the PFETs ($M_{P12}$, $M_{P15}$, $M_{P16}$) 605, 606, 607 stacked drain-to-source between the voltage supply line ($V_{DD2}$) 507 and the drain of the NFET ($M_{N11}$) 608. The source of the NFET ($M_{N11}$) 608 is coupled to ground. The gate of the PFET ($M_{P12}$) 605 is coupled to its own drain. The gate of the PFET ($M_{P15}$) 606 is also coupled to its own drain. The gates of the PFET ($M_{P16}$) 607 and the NFET ($M_{N11}$) 608 are coupled to receive the incoming logic signal ($V_{in}$) from the source logic.

Figure 7:
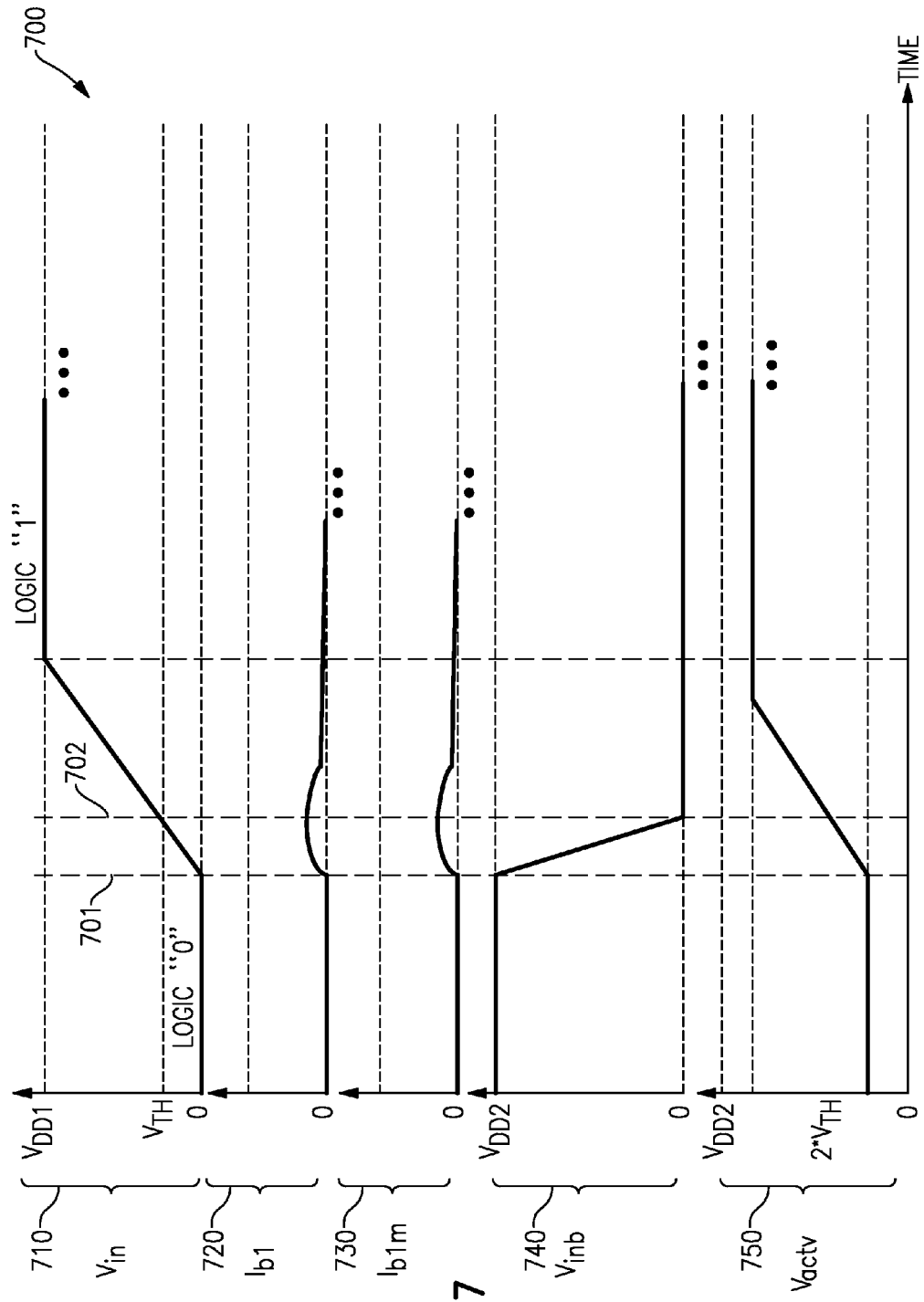
FIG. 7 is a performance diagram showing limited current produced by the operating configuration of FIG. 6 in accordance with some implementations.

In operation, the feedback bias node 612 is used to deliver a bias modification condition to the feedback PFET ($M_{P10}$) 601, which in turn, imposes the bias modification condition on the operation of the input buffer 510. More specifically, the biasing of the feedback PFET ($M_{P10}$) is controlled to substantially reduce, if not eliminate, crowbar currents when the voltage level of a first logic state (e.g., binary "1") of an incoming logic signal is substantially lower than the voltage supply level $V_{DD2}$ correspondingly used by the receiving logic 540 for the first logic state. For additional clarity, the operation of the closed-loop feedback crowbar current limiter 520 is described with reference to FIG. 7. FIG. 7 is a performance diagram 700 showing limited current responses ($I_{b1}$, $I_{b1m}$) 720, 730 and voltage responses ($V_{inb}$, $V_{actv}$) 740, 750 produced in response to a voltage level transition 710 of the incoming logic signal ($V_{in}$).

As an example with reference to FIGS. 6 and 7, under a first set of operating conditions the incoming logic signal ($V_{in}$) has a value of binary "0" corresponding to a voltage level of zero volts. Those skilled in the art will appreciate that an incoming logic signal can start with either a value of binary "0" or binary "1" (or an unstable meta-state), and that the first set of operating conditions described herein is merely an example provided to discuss some pertinent features of the level-shift circuit 600. With $V_{in}$ starting at zero volts, the PFET ($M_{P5}$) 511 is on and the NFET ($M_{N5}$) 512 is off, resulting in node 519 being pulled to binary "1" or equivalently $V_{DD2}$. The output buffer 530 inverts the binary "1" providing a binary "0." The NFET ($M_{N11}$) 608 is also off when is $V_{in}$ at zero volts, which substantially suppresses the current $I_{b1}$ in the second branch. In turn, the current $I_{b1m}$ is also suppressed in the first branch because the current $I_{b1m}$ has a mirror relationship with current $I_{b1}$ that is regulated by the PFETs ($M_{P11}$, $M_{P12}$) 602, 605. By contrast, the PFETs ($M_{P13}$, $M_{P14}$) 603, 604 are biased on, which pulls the voltage $V_{actv}$ on node 612 to within $2V_{th}$ (i.e., twice the FET threshold voltage) of the ground potential. In response, the feedback PFET ($M_{P10}$) 601 is biased to an on state. With the feedback PFET ($M_{P10}$) 601 thus enabled, the output node 519 is pulled to the voltage supply level $V_{DD2}$. The currents $I_{CBin}$, $I_{b1m}$, $I_{b1}$ are each substantially restricted and in some circumstances can each be assumed to be zero.

As indicated by time marker 701, the voltage level of the incoming logic signal ($V_{in}$) starts to increase, approaching a FET threshold voltage ($V_{th}$) at time marker 702. As this occurs, respective leakage currents begin to flow through the NFETs ($M_{N5}$, $M_{N11}$) 512, 608, because the PFETs ($M_{P1}$, $M_{P10}$) 511, 601 are biased on. The leakage current $I_{b1}$, through the NFET ($M_{N11}$) 608, is reflected by the PFETs ($M_{P11}$, $M_{P12}$) 602, 605 into the first branch as the current $I_{b1m}$. As the current $I_{b1m}$ increases, the voltage $V_{actv}$ on node 612 rises. The rising voltage $V_{actv}$, in turn, biases the feedback PFET ($M_{P10}$) 601 off, which suppresses a crowbar current $I_{CBin}$ from flowing as the NFET ($M_{N5}$) 512 enters an on state in response to the rising $V_{in}$. In some implementations, the NFET ($M_{N11}$) 608 is sized to turn on sooner than the NFET ($M_{N5}$) 512 in response to the same voltage transitions. With the feedback PFET ($M_{P10}$) 601 off and the NFET ($M_{N5}$) 512 on, the output node 519 is pulled to binary "0" or the ground potential—but without the substantial crowbar current $I_{CBin}$ that would be produced in previously available level-shift circuits (described above). The binary "0" at output node 519 is converted to a binary "1" by the output buffer 530.

As the voltage level of the incoming logic signal ($V_{in}$) continues to rise, the PFET ($M_{P12}$) 605 turns off as a result of a shrinking $V_{gs}$ (i.e., gate-to-source voltage). More specifically, the gate voltage of the PFET ($M_{P12}$) 605 rises along with a rising $V_{in}$ at least in part because of diode-clamping provided by the PFETs ($M_{P15}$, $M_{P16}$) 606, 607. In some implementations, one or both of the PFETs ($M_{P15}$, $M_{P16}$) 606, 607 are provided with long channel lengths in order to enhance the $V_{gs}$ voltages of each, which enables turning off the PFET ($M_{P12}$) 605 before the $2V_{th}$ voltage level. In some implementations, turning off the PFET ($M_{P12}$) 605 substantially reduces the currents $I_{b1m}$ and $I_{b1}$ that would otherwise result from increasing the $V_{gs}$ on the NFET ($M_{N11}$) 608 as $V_{in}$ rises. In some implementations, the PFET ($M_{P12}$) 605 is not turned off. Moreover, the feedback PFET ($M_{P10}$) 601 remains off as the voltage $V_{actv}$ on the node 612 continues to rise in response to a rising $V_{in}$ due to diode-clamping of PFET ($M_{P13}$) 603 and PFET ($M_{P14}$) 604.

With the feedback PFET ($M_{P10}$) 601 off, $I_{CBin}$ is substantially zero even though the incoming logic signal ($V_{in}$) is more than a $V_{gs}$ below $V_{DD2}$. If the incoming logic signal ($V_{in}$) increases to less than a $V_{th}$ of $V_{DD2}$, then the PFET ($M_{P5}$) 511 is biased off. As the voltage level of the incoming logic signal ($V_{in}$) approaches the voltage supply level $V_{DD2}$ utilized by the level-shifter, the PFET ($M_{P5}$) 511 is biased off when its $V_{gs}$ falls below $V_{th}$. Those skilled in the art will appreciate from the present disclosure that the reverse sequence occurs in response to a falling $V_{in}$ (i.e., caused by a transition from binary "1" to binary "0").

Figure 8:
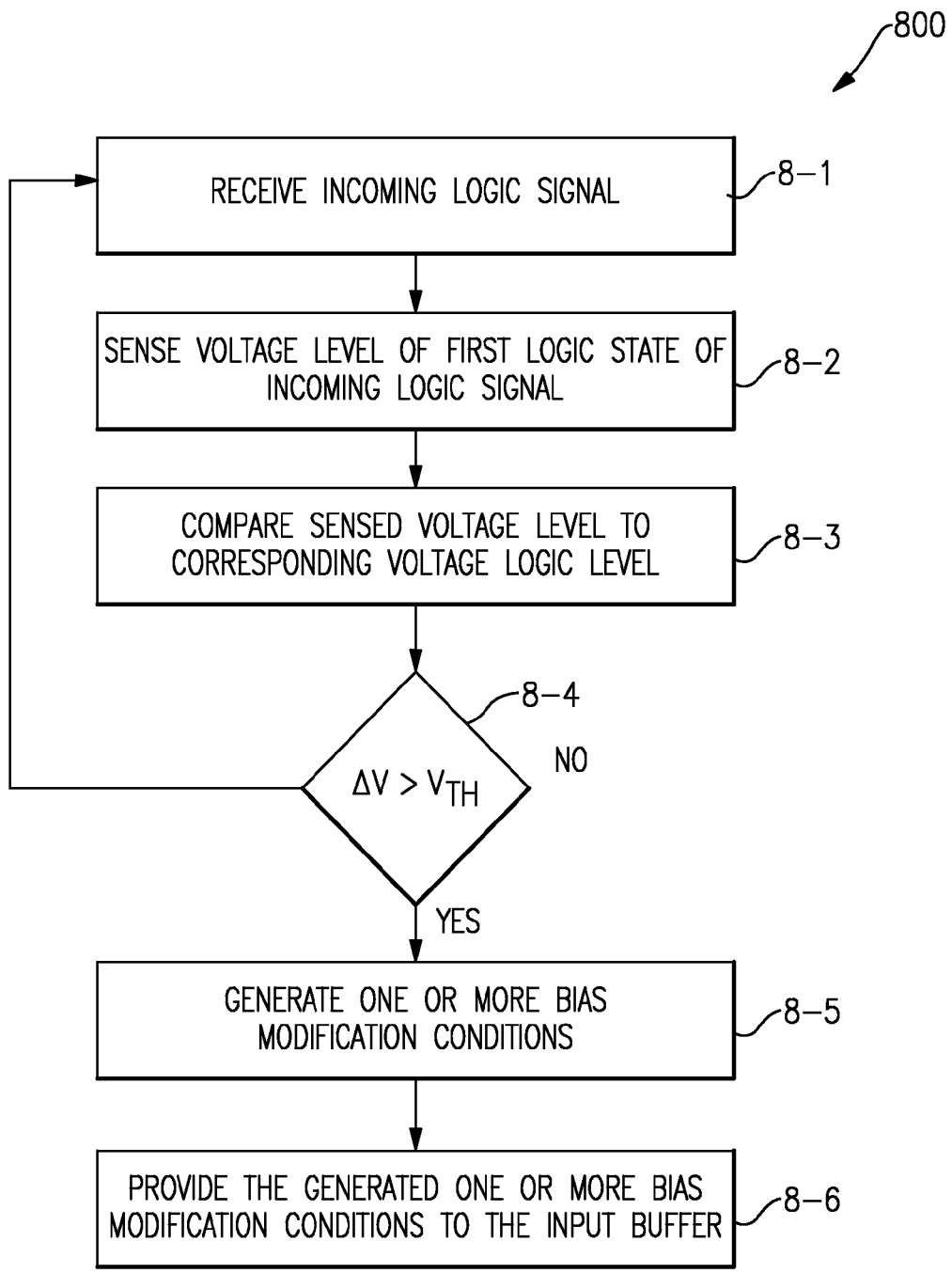
FIG. 8 is a flowchart of an implementation of a method of limiting crowbar current in a level shift circuit in accordance with some implementations.

FIG. 8 is a flowchart of an implementation of a method 800 of suppressing the generation of a crowbar current in a level-shift circuit according to some implementations. In some implementations, the method 800 is performed by a feedback control circuit (e.g., the closed-loop feedback crowbar current limiter 520 of FIG. 6). In some implementations, the method 800 is performed by a processor executing one or more computer readable instructions stored in one or more memory devices constituting a non-transitory computer readable storage medium (e.g., the closed-loop feedback crowbar current limiter 520 of FIG. 5 including a processing and memory). Briefly, the method 800 includes sensing a voltage difference between corresponding voltage logic levels, generating one or more bias modification conditions, and providing the one or more bias modification conditions to an input buffer of the level-shift circuit.

To that end, as represented by block 8-1, method 800 includes receiving an incoming logic signal. As represented by block 8-2, the method 800 includes sensing the voltage level of a first logic state (e.g., binary "1") of the incoming logic signal. As represented by block 8-3, the method 800 includes comparing the sensed voltage level to a corresponding voltage logic level of the receiving logic in order to determine a voltage difference (ΔV). As represented by block 8-4, the method 800 includes determining whether or not the voltage difference (ΔV) breaches a threshold voltage ($V_{TH}$). If the voltage difference does not breach the threshold voltage ("No" path from block 8-4), the method 800 circles back to the portion of the method 800 represented by block 8-1. If the voltage difference breaches the threshold voltage ("Yes" path from block 8-4), as represented by block 8-5, the method 800 includes generating one or more bias modification conditions. As represented by block 8-6, the method includes providing the one or more bias modification conditions to the input buffer to suppress the generation of a crowbar current.

Figure 9:
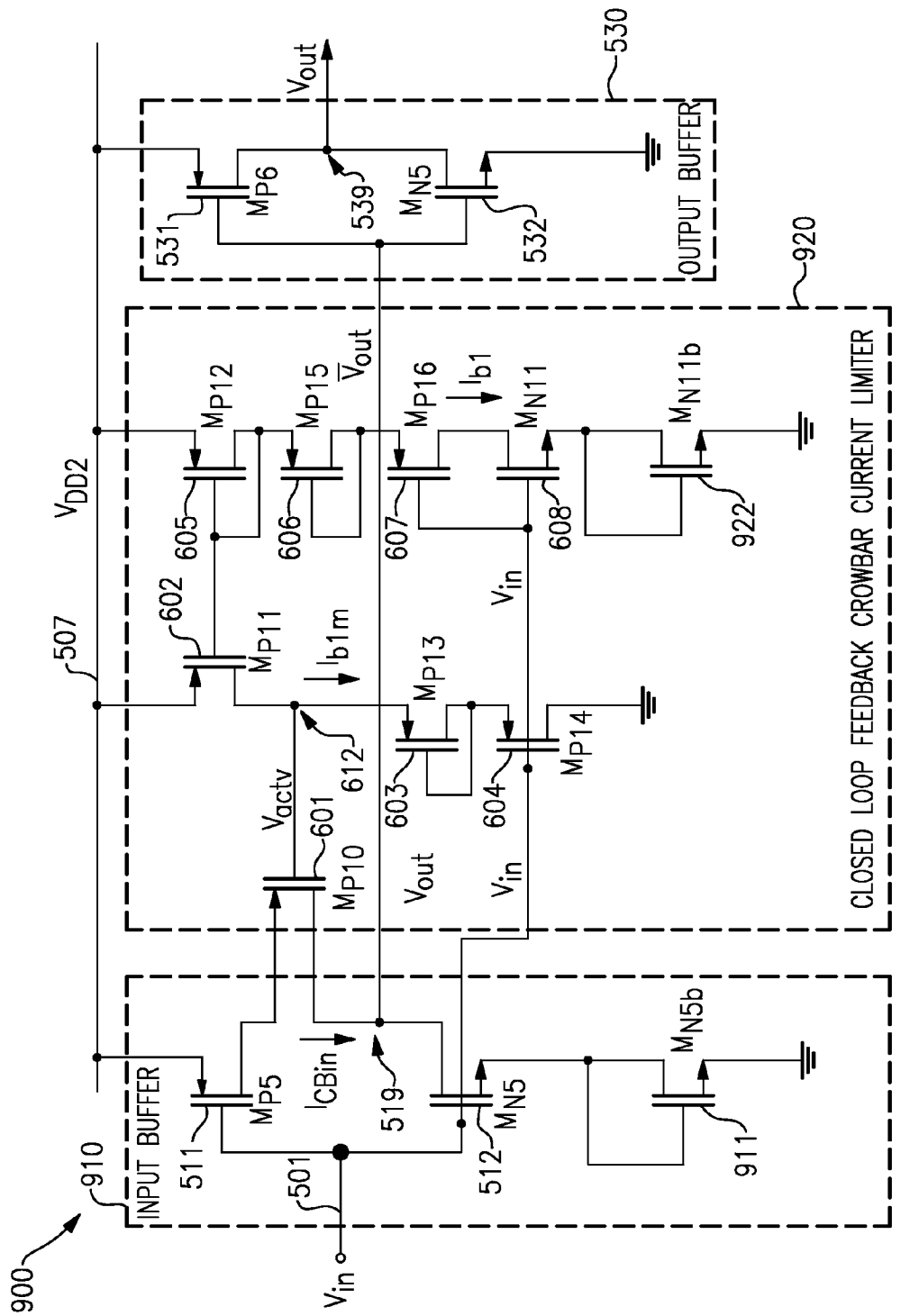
FIG. 9 is a schematic diagram of a level shift circuit including a closed-loop feedback crowbar current limiter in accordance with some implementations.

FIG. 9 is a schematic diagram of an implementation of a level-shift circuit 900 including a circuit implementation of a closed-loop feedback crowbar current limiter 920. The level-shift circuit 900 illustrated in FIG. 9 is similar to and adapted from the level-shift circuit illustrated in FIG. 6. Elements common to both implementations include common reference numbers, and only the differences between FIGS. 6 and 9 are described herein for the sake of brevity. Again, while certain specific features are illustrated, those skilled in the art will appreciate from the present disclosure that various other features have not been illustrated for the sake of brevity, and so as not to obscure more pertinent aspects of the implementations disclosed herein.

To that end, the level-shift circuit 900 includes an input buffer 910, which is similar to the input buffer 510 included in FIG. 5. As compared the input buffer 510, the input buffer 910 additionally includes a diode-connected NFET ($M_{N5b}$) 911 coupled between the NFET ($M_{N5}$) 512 and ground. The source of the NFET ($M_{N5b}$) 911 is coupled to ground, and the gate and drain terminals are coupled to the source of the NFET ($M_{N5}$) 512. The circuit implementation of a closed-loop feedback crowbar current limiter 920 is similar to the circuit implementation of a closed-loop feedback crowbar current limiter 520 provide in FIG. 5. As compared to FIG. 5, the circuit implementation of a closed-loop feedback crowbar current limiter 920 additionally includes a diode-connected NFET ($M_{N11b}$) 922 coupled between the NFET ($M_{N11}$) 608 and ground. The source of the NFET ($M_{N11b}$) 922 is coupled to ground, and the gate and drain terminals are coupled to the source of the NFET ($M_{N1}$) 608. In operation, the additional NFETs ($M_{N5b}$, $M_{N11b}$) 911, 922 provide additional noise margin for the logic state associated with ground (typically, binary "0").

Figures 10A, 10B:
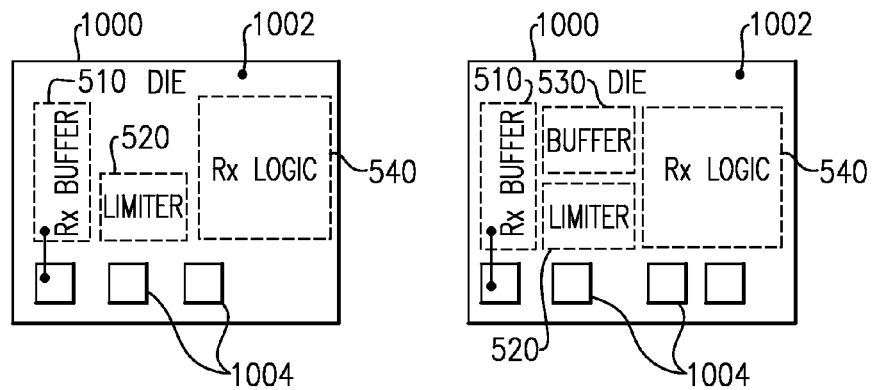
FIGS. 10A and 10B are block diagrams of different integrated circuit implementations of the crowbar current limited level shift circuit of FIG. 6.

FIGS. 10A and 10B are schematic diagrams of different integrated circuit implementations of the level-shift circuits of FIGS. 5, 6 and 9. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 10A shows that in some implementations, some or all portions of each of the input buffer 510, the closed-loop feedback crowbar current limiter 520, and the receiving logic 540 can be part of a semiconductor die 1000. By way of an example, the input buffer 510, the closed-loop feedback crowbar current limiter 520, and the receiving logic 540 can be formed on a substrate 1002 of the die 1000. A plurality of connection pads 1004 can also be formed on the substrate 1002 to facilitate functionalities associated with some or all portions of each of the input buffer 510, the closed-loop feedback crowbar current limiter 520, and the receiving logic 540.

FIG. 10B shows that in some implementations, a semiconductor die 1000 having a substrate 1002 can include some or all portions of each of the input buffer 510, the output buffer 530 and the closed-loop feedback crowbar current limiter 520. A plurality of connection pads 1004 can also be formed on the substrate 1002 to facilitate functionalities associated with some or all portions of each of the input buffer 510, the output buffer 530, the closed-loop feedback crowbar current limiter 520, and the receiving logic 540.

Figure 11:
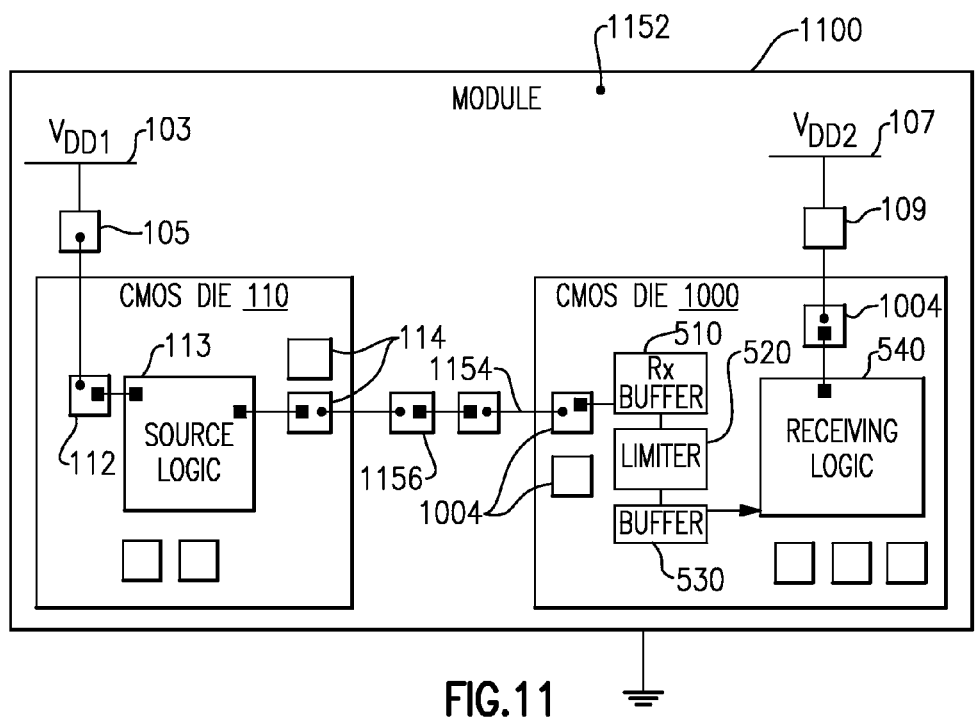
FIG. 11 is a schematic diagram of an implementation of a module including the crowbar current limited level shift circuit of FIG. 6.

In some implementations, one or more features described herein can be included in a module. FIG. 11 is a schematic diagram of an implementation of a module 1100 including the level-shift circuits of FIGS. 5, 6 and 9. The module 1100 is similar to and adapted from the module 100 illustrate in FIG. 1. Elements common to each include common reference numbers, and only the differences between FIGS. 1 and 11 are described herein for the sake of brevity. Moreover, while some example features are illustrated, those skilled in the art will appreciate from the present disclosure that various other features have not been illustrated for the sake of brevity and so as not to obscure more pertinent aspects of the example implementations disclosed herein.

To that end, the module 1100 additionally includes a packaging substrate 1152, connection pads 1156, and a CMOS die 1000 including an implementation of the level-shift circuits of FIGS. 5, 6 and 9. The CMOS die 1000 includes a substrate 1002 including some or all portions of the each of the input buffer 510, the output buffer 530, the closed-loop feedback crowbar current limiter 520, and the receiving logic 540. A plurality of connection pads 1004 is formed on the substrate 1002 to facilitate functionalities associated with some or all portions of the input buffer 510, the output buffer 530, the closed-loop feedback crowbar current limiter 520, and the receiving logic 540.

The connection pads 1156 on the packaging substrate 1152 facilitate electrical connections to and from each of the CMOS die 1000, the input buffer 510, the output buffer 530, the closed-loop feedback crowbar current limiter 520, and the receiving logic 540. For example, the connection pads 1156 facilitate the use of wirebonds 1154 for passing various signals and supply currents and/or voltages to the CMOS die 1000.

In some implementations, the components mounted on the packaging substrate 1152 or formed on or in the packaging substrate 1152 can further include, for example, one or more surface mount devices (SMDs). In some embodiments, the packaging substrate 1152 can include a laminate substrate.

In some implementations, the module 1100 can also include one or more packaging structures to, for example, provide protection and facilitate easier handling of the module 1100. Such a packaging structure can include an overmold formed over the packaging substrate 1152 and dimensioned to substantially encapsulate the various circuits and components thereon.

It will be understood that although the module 1150 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. That is, those skilled in the art will also appreciate from the present disclosure that in various implementations the power amplifier open loop current clamp may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display and/or other user interface components such as a keyboard, a touch screen display, a mouse, a trackpad, a digital camera and/or any number of supplemental devices to add functionality.

Figure 12:
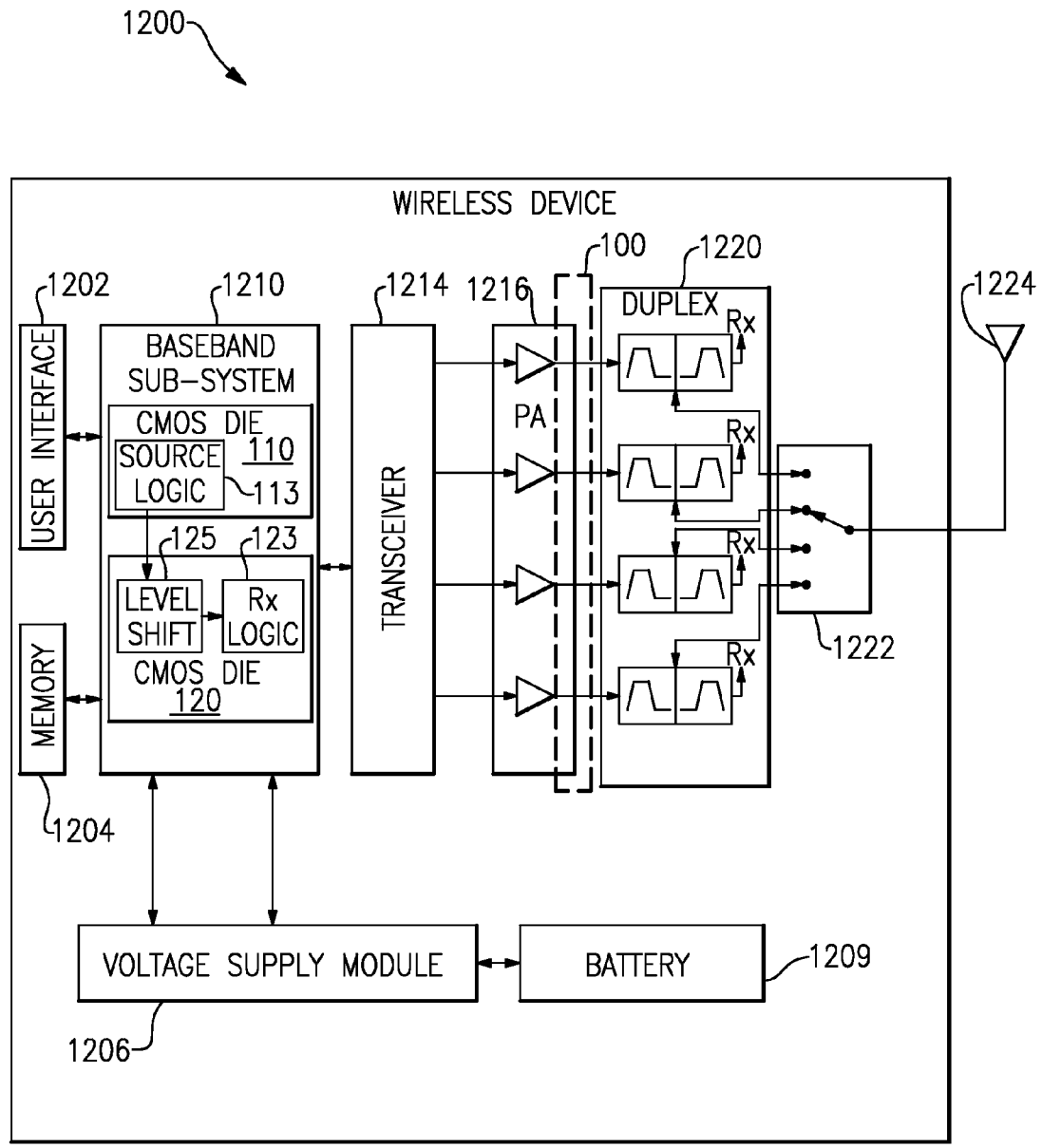
FIG. 12 is a schematic diagram of a wireless device including the crowbar current limited level shift circuit of FIG. 6.

For example, FIG. 12 is a schematic diagram of a wireless device 1200 including the crowbar current limited level shift circuit 600 of FIG. 6. While some example features are illustrated, those skilled in the art will appreciate from the present disclosure that various other features have not been illustrated for the sake of brevity and so as not to obscure more pertinent aspects of the example implementations disclosed herein.

As shown in FIG. 12, in some implementations, the wireless device includes the power amplifiers (Pas) 1216 are packaged into a module including matching circuits 100. The PAs 1216 can receive respective RF signals from a transceiver 1214, that can be configured and operated in known manners to generate RF signals to be amplified and transmitted, and to process received signals. The transceiver 1214 is shown to interact with a baseband sub-system 1210 that is configured to provide conversion between data and/or voice signals suitable for a user and RF signals suitable for the transceiver 1214. The transceiver 1214 is also shown to be connected to a voltage supply module 1206 that is configured to manage the delivery of two or more voltage supply levels to various components of the wireless device 1200. The voltage supply levels are derived from the battery 1209, and provided to various components including the baseband sub-system 1210.

The baseband sub-system 1210 is shown to be connected to a user interface 1202 to facilitate various input and output of voice and/or data provided to and received from the user. The baseband sub-system 1210 can also be connected to a memory 1204 that is configured to store data and/or instructions to facilitate the operation of the wireless device, and/or to provide storage of information for the user. In some implementations, the baseband sub-system 1210 includes a first and second chips 110, 120 (i.e., CMOS die 110 and CMOS die 120) powered by respective first and second voltage supply lines $V_{DD1}$, $V_{DD2}$ (as shown in FIG. 1). The first chip 110 (i.e., CMOS die 110) includes source logic 113, which is coupled to the first voltage supply line ($V_{DD1}$), and supplies an output logic signal that is routed to the second chip 120. The second chip 120 (i.e., CMOS die 120) includes receiving logic 123 and a level-shift circuit 125. The receiving logic 123 and the level-shift circuit 125 are coupled to the second voltage supply line ($V_{DD2}$). The level-shift circuit 125 is coupled to receive the logic signal provided by the first chip 110, and also to the receiving logic 123 in order to provide a translated logic signal. In operation, the level-shift circuit 125 operates to translate the voltage logic levels of the logic signal provided by the first chip 110 to the corresponding voltage logic levels used by the receiving logic 123 using a closed-loop feedback crowbar current limiting assembly in accordance with various implementations.

In the example wireless device 1200, outputs of the PAs 1216 are shown to be matched and routed to an antenna 1224 via respective duplexers 1220 and a band-selection switch 1222. The band-selection switch 1222 can include, for example, a single-pole-multiple-throw (e.g., SP4T) switch to allow selection of an operating band (e.g., Band 2). In some embodiments, each duplexer 1220 can allow transmit and receive operations to be performed simultaneously using a common antenna (e.g., 1224).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, without changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A level-shift circuit comprising:
   an input buffer configured to receive an incoming logic signal that is set relative to a first electrical level, and in response, provide a level-shifted logic signal that is set relative to a second electrical level and is logically consistent with the incoming logic signal; and
   a current limiter configured to suppress the generation of current associated with the input buffer by providing a bias modification condition to the input buffer, in order to adjust the operation of the input buffer, in response to sensing a voltage difference between the first electrical level and the second electrical level that breaches a threshold, the current limiter includes a feedback transistor and a mirror-based feedback circuit separate from the feedback transistor including a first branch configured to impose the bias modification condition on the input buffer by activating the feedback transistor, the first branch responsive to the incoming logic signal and a control current, and a second branch configured to generate the control current in response to sensing a voltage transition in the incoming logic signal.

2. The level-shift circuit of claim 1 wherein the input buffer includes a logic inverter having an input node configured to receive the incoming logic signal, and an output node configured to provide the level-shifted logic signal.

3. The level-shift circuit of claim 2 wherein the level-shift circuit includes an output buffer configured to invert the level-shifted logic signal provided at the output of the input buffer.

4. The level-shift circuit of claim 1 wherein the first electrical level includes a first voltage level, and the second electrical level includes a second voltage level that is different from the first voltage level.

5. The level-shift circuit of claim 4 wherein the first voltage level is lower than the second voltage level.

6. The level-shift circuit of claim 4 wherein the first voltage level is a first ground potential level associated with source logic, and the second voltage level is a second ground potential level associated with receiving logic.

7. The level-shift circuit of claim 4 wherein the current limiter is configured to produce the bias modification condition such that the bias modification condition tracks the sensed voltage difference.

8. The level-shift circuit of claim 1 wherein the input buffer includes a first NFET and the second branch of the current limiter includes a second NFET that is sized to turn on sooner than the first NFET in response to the same voltage transitions of the incoming logic signal.

9. The level-shift circuit of claim 8 wherein the input buffer includes a diode-connected NFET coupled between the first NFET and ground, and the second branch of the current limiter includes another diode-connected NFET coupled between the second NFET and ground.

10. The level-shift circuit of claim 1 wherein the second branch of the current limiter includes a FET that is sized to turn off before a voltage level associated with the threshold voltage of another FET.

11. The level-shift circuit of claim 1 wherein the incoming logic signal includes a plurality of logic states, and each of the plurality of logic states is set relative to the first electrical level, and each of the plurality of logic states is set relative to the second electrical level.

12. The level-shift circuit of claim 1 included on a chip with receiving logic, the level-shift circuit and the receiving logic having a common voltage supply level associated with the second electrical level.

13. The level-shift circuit of claim 1 arranged between source logic and receiving logic, wherein the source logic receives a first voltage supply level, and the level-shift circuit and the receiving logic receive a second voltage supply level.

14. A module comprising:
    a packaging substrate configured to receive a plurality of components;
    an input buffer at least partially included on the packaging substrate, the input buffer configured to receive an incoming logic signal that is set relative to a first electrical level, and in response, provide a level-shifted logic signal that is set relative to a second electrical level and is logically consistent with the incoming logic signal; and
    a current limiter at least partially included on the packaging substrate, the current limiter configured to suppress the generation of current associated with the input buffer by providing a bias modification condition to the input buffer, in order to adjust the operation of the input buffer, in response to sensing a voltage difference between the first electrical level and the second electrical level that breaches a threshold, the current limiter includes a feedback transistor and a mirror-based feedback circuit separate from the feedback transistor including a first branch configured to impose the bias modification condition on the input buffer by activating the feedback transistor, the first branch responsive to the incoming logic signal and a control current, and a second branch configured to generate the control current in response to sensing a voltage transition in the incoming logic signal.

15. The module of claim 14 wherein at least a portion of each of the input buffer and the current limiter are included on a first chip configured to receive a voltage supply level associated with the second electrical level.

16. The module of claim 15 wherein the first chip includes:
    receiving logic coupled to receive the level-shifted logic signal; and
    an output buffer coupled between the input buffer and the receiving logic.

17. The module of claim 14 further comprising source logic on a second chip configured to receive a voltage supply level associated with the first electrical level, the source logic also coupled to provide the incoming logic signal to the input buffer.

18. A device comprising:
    a baseband module, the baseband module including a packaging substrate configured to receive a plurality of components, the baseband module further including an input buffer configured to receive an incoming logic signal that is set relative to a first electrical level, and in response, provide a level-shifted logic signal that is set relative to a second electrical level and is logically consistent with the incoming logic signal, and a current limiter at least partially included on the packaging substrate, the current limiter configured to suppress the generation of current associated with the input buffer by providing a bias modification condition to the input buffer, in order to adjust the operation of the input buffer, in response to sensing a voltage difference between the first electrical level and the second electrical level that breaches a threshold, the current limiter includes a feedback transistor and a mirror-based feedback circuit separate from the feedback transistor including a first branch configured to impose the bias modification condition on the input buffer by activating the feedback transistor, the first branch responsive to the incoming logic signal and a control current, and a second branch configured to generate the control current in response to sensing a voltage transition in the incoming logic signal;

a transceiver in communication with the baseband module, the transceiver configured to generate a (radio frequency) RF signal;

a front-end module (FEM) in communication with the transceiver, the FEM including a packaging substrate configured to receive a plurality of components, the FEM further including a power amplifier (PA) implemented on the packaging substrate, the PA configured to amplify the RF signal; and an antenna in communication with the FEM, the antenna configured to transmit the amplified RF signal.

* * * * *